United States Patent
Huang et al.

(10) Patent No.: US 9,803,109 B2
(45) Date of Patent: Oct. 31, 2017

(54) CMP COMPOSITION FOR SILICON NITRIDE REMOVAL

(71) Applicant: Cabot Microelectronics Corporation, Aurora, IL (US)

(72) Inventors: Hung-Tsung Huang, Tainan (TW); Ming-Chih Yeh, Taipei County (TW); Chih-Pin Tsai, Kaohsiung (TW)

(73) Assignee: Cabot Microelectronics Corporation, Aurora, IL (US)

(*) Notice: Subject to any disclaimer, the term of this patent is extended or adjusted under 35 U.S.C. 154(b) by 0 days.

(21) Appl. No.: 14/612,736

(22) Filed: Feb. 3, 2015

(65) Prior Publication Data

US 2016/0222254 A1    Aug. 4, 2016

(51) Int. Cl.
| | |
|---|---|
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C25F 3/00 | (2006.01) |
| C09K 13/00 | (2006.01) |
| C09K 13/04 | (2006.01) |
| C09G 1/04 | (2006.01) |
| C09G 1/00 | (2006.01) |
| H01L 21/321 | (2006.01) |
| H01L 21/306 | (2006.01) |
| C09G 1/02 | (2006.01) |
| H01L 21/304 | (2006.01) |
| H01L 21/3105 | (2006.01) |
| C09D 1/02 | (2006.01) |
| C09K 3/14 | (2006.01) |

(52) U.S. Cl.
CPC ............. *C09G 1/04* (2013.01); *C09D 1/02* (2013.01); *C09G 1/00* (2013.01); *C09G 1/02* (2013.01); *H01L 21/304* (2013.01); *H01L 21/30625* (2013.01); *H01L 21/31053* (2013.01); *H01L 21/3212* (2013.01); *C09K 3/14* (2013.01)

(58) Field of Classification Search
None
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,821,897 B2 * | 11/2004 | Schroeder | C09G 1/02 257/E21.304 |
| 6,872,328 B2 * | 3/2005 | Dirksen | C09G 1/02 252/79.1 |
| 2003/0092265 A1 | 5/2003 | Kim et al. | |
| 2005/0148186 A1 | 7/2005 | Jung et al. | |
| 2007/0181850 A1 | 8/2007 | Kamimura et al. | |
| 2007/0220813 A1 | 9/2007 | Nam et al. | |
| 2007/0298612 A1 | 12/2007 | Dysard et al. | |
| 2008/0003829 A1 | 1/2008 | Shin et al. | |
| 2008/0057716 A1 * | 3/2008 | Yamashita | C09G 1/02 438/693 |
| 2010/0009538 A1 | 1/2010 | Kamimura | |
| 2010/0144149 A1 | 6/2010 | Ward et al. | |
| 2012/0235081 A1 | 9/2012 | Raman et al. | |
| 2014/0099790 A1 | 4/2014 | Shi et al. | |

FOREIGN PATENT DOCUMENTS

| | | |
|---|---|---|
| CN | 101490201 A | 7/2009 |
| WO | 2011/005456 * | 1/2011 |
| WO | WO 2011/005456 A2 | 1/2011 |
| WO | WO 2013/093557 A1 | 6/2013 |

OTHER PUBLICATIONS

Korean Intellectual Property Office, International Search Report issued in connection with International Patent Application No. PCT/US2016/014858 dated Jun. 16, 2016.

Taiwan Intellectual Property Office, Search Report issued in connection with Taiwan Patent Application No. 105103564 dated Sep. 7, 2016.

* cited by examiner

*Primary Examiner* — Stephanie Duclair
(74) *Attorney, Agent, or Firm* — Thomas Omholt; Erika W. Wilson; Francis J. Koszyk

(57) ABSTRACT

The invention provides a chemical-mechanical polishing composition comprising: (a) colloidal silica particles that are surface modified with metal ions selected from Mg, Ca, Al, B, Be, and combinations thereof, and wherein the colloidal silica particles have a surface hydroxyl group density of from about 1.5 hydroxyls per $nm^2$ to about 8 hydroxyls per $nm^2$ of a surface area of the particles, (b) an anionic surfactant, (c) a buffering agent, and (d) water, wherein the polishing composition has a pH of about 2 to about 7, and wherein the polishing composition is substantially free of an oxidizing agent that oxidizes a metal. The invention further provides a method of chemically-mechanically polishing a substrate with the inventive chemical-mechanical polishing composition. Typically, the substrate contains silicon nitride, silicon oxide, and/or polysilicon.

21 Claims, No Drawings

CMP COMPOSITION FOR SILICON NITRIDE REMOVAL

BACKGROUND OF THE INVENTION

As an enabling technology, the high-K metal gate module was introduced for modern logic devices (45 nm technology node and beyond) for performance improvement. The replacement metal gate (gate-last) approach has become the mainstream technology for the high-k metal gate module in advanced device manufacturing, especially for 20 nm and beyond. For the replacement metal gate module, several key CMP processes, including selective oxide/nitride polishing, poly open polishing (POP) and self aligned contact (SAC), must be optimized to meet the stringent planarity and defect requirements. While there exist multiple processes for fabricating the devices, frequently silicon nitride is used as a capping layer and as an etch stop layer. For POP and SAC steps, it is very challenging to selectively remove a capping silicon nitride layer and to stop well on either the polysilicon gate or oxide layer for accurate gate height control, and to minimize oxide loss or erosion around the gate. Meanwhile, erosion on the POP step may lead to metal residue, such as aluminum, following deposition of a metal layer and subsequent metal polishing to form the gate.

There are typically two steps of CMP polishing in the replacement metal gate (RMG) process: (i) removing bulk oxide, topography planarization, and selectively stopping on the nitride stress and cap layers, and (ii) a higher rate of nitride polishing with tunable selectivities to oxide. Typically, silica based or ceria based slurries for the first step should be higher selectivity of oxide to nitride. In practice, there will be non-uniformity of nitride loss and surrounding oxide dishing. It is critical for POP polishing to minimize this surface topography, or it may lead to poor gate height control and to defectivity in subsequent metallization steps. In general, a flexible nitride to oxide selectivity is needed for POP polishing to meet the stringent requirements in the RMG process. The challenge in SAC similarly requires a higher selectivity of nitride to oxide which provides excellent planarization efficiency and topography.

Thus, there remains a need in the art for polishing compositions and methods that can provide desirable tunable selectivity of silicon nitride, silicon oxide, and polysilicon and that have suitable removal rates.

BRIEF SUMMARY OF THE INVENTION

The invention provides a chemical-mechanical polishing composition comprising (a) colloidal silica particles that are surface modified with metal ions selected from Mg, Ca, Al, B, Be, and combinations thereof, and wherein the colloidal silica particles have a surface hydroxyl group density of from about 1.5 hydroxyls per $nm^2$ to about 8 hydroxyls per $nm^2$ of a surface area of the particles, (b) an anionic surfactant, (c) a buffering agent, and (d) water, wherein the polishing composition has a pH of about 2 to about 7, and wherein the polishing composition is free or substantially free of an oxidizing agent that oxidizes a metal.

The invention also provides a method of chemically mechanically polishing a substrate comprising (i) contacting a substrate with a polishing pad and a chemical-mechanical polishing composition comprising (a) colloidal silica particles that are surface modified with metal ions selected from Mg, Ca, Al, B, Be, and combinations thereof, and wherein the colloidal silica particles have a surface hydroxyl group density of from about 1.5 hydroxyls per $nm^2$ to about 8 hydroxyls per $nm^2$ of a surface area of the particles, (b) an anionic surfactant, (c) a buffering agent, and (d) water, wherein the polishing composition has a pH of about 2 to about 7, and wherein the polishing composition is free or substantially free of an oxidizing agent that oxidizes a metal, (ii) moving the polishing pad and the chemical mechanical polishing composition relative to the substrate, and (iii) abrading at least a portion of the substrate to polish the substrate.

DETAILED DESCRIPTION OF THE INVENTION

The invention provides a chemical-mechanical polishing composition comprising, consisting essentially of, or consisting of (a) colloidal silica particles that are surface modified with metal ions selected from Mg, Ca, Al, B, Be, and combinations thereof, and wherein the colloidal silica particles have a surface hydroxyl group density of from about 1.5 hydroxyls per $nm^2$ to about 8 hydroxyls per $nm^2$ of a surface area of the particles, (b) an anionic surfactant, (c) a buffering agent, and (d) water, wherein the polishing composition has a pH of about 2 to about 7, and wherein the polishing composition is free or substantially free of an oxidizing agent that oxidizes a metal.

The polishing composition comprises an abrasive consisting of colloidal silica particles that are surface-modified with metal ions selected from Mg, Ca, Al, B, Be, and combinations thereof. In a preferred embodiment, the metal ions are aluminum ions (i.e., Al(III)). The colloidal silica particles can be any suitable colloidal silica particles and are typically "wet-process" colloidal silica particles. As used herein, "wet-process" silica refers to a silica prepared by a precipitation, condensation-polymerization, or similar process (as opposed to, for example, fumed or pyrogenic silica). The colloidal silica particles are prepared in the absence of a metal ion, such that the colloidal silica particles, prior to surface modification with metal ions selected from Mg, Ca, Al, B, and/or Be, are free or substantially free of metal ions. Preferably, the colloidal silica particles are prepared by condensation-polymerization of $Si(OH)_4$. The precursor $Si(OH)_4$ can be obtained, for example, by hydrolysis of high purity alkoxysilanes such as tetraethylorthosilicate (TEOS). Such colloidal silica can be obtained as various commercially available products, such as the Fuso PL-1, PL-1H, PL-1SL, PL-2, PL-2L, PL-3, PL-3H, PL-3L, PL-5, PL-6L, PL-7, PL-7H, PL-10H, PL-SH3 and PL-20 products, and the Nalco 1050, 2327, and 2329 products, as well as other similar products available from DuPont, Bayer, Applied Research, Nissan Chemical, and Clariant.

The colloidal silica particles can have a surface hydroxyl group density of about 1.5 hydroxyls per $nm^2$ of the surface area of the particles or more, for example, about 1.6 hydroxyls per $nm^2$ or more, about 1.7 hydroxyls per $nm^2$ or more, about 1.8 hydroxyls per $nm^2$ or more, about 1.9 hydroxyls per $nm^2$ or more, about 2.0 hydroxyls per $nm^2$ or more, about 2.2 hydroxyls per $nm^2$ or more, about 2.4 hydroxyls per $nm^2$ or more, about 2.6 hydroxyls per $nm^2$ or more, about 2.8 hydroxyls per $nm^2$ or more, about 3 hydroxyls per $nm^2$ or more, about 4 hydroxyls per $nm^2$ or more, or about 5 hydroxyls per $nm^2$ or more. Alternatively, or in addition, the colloidal silica particles can have a surface hydroxyl group density of about 8 hydroxyls per $nm^2$ of the surface area of the particles or less, for example, about 7.5 hydroxyls per $nm^2$ or less, about 7 hydroxyls per $nm^2$ or less, about 6.5 hydroxyls per $nm^2$ or less, about 6 hydroxyls per $nm^2$ or less, about 5.5 hydroxyls per $nm^2$ or less, or about 5 hydroxyls per nm$^2$ or less. Thus, the colloidal silica particles can have a surface hydroxyl group density bounded by any two of the aforementioned endpoints. For example, the colloidal silica particles can have a surface hydroxyl group density of from about 1.5 hydroxyls per nm$^2$ to about 8 hydroxyls per nm$^2$ of the surface area of the particles, about 1.6 hydroxyls per nm$^2$ to about 8 hydroxyls per nm$^2$, about 1.7 hydroxyls per nm$^2$ to about 8 hydroxyls per nm$^2$, about 1.8 hydroxyls per nm$^2$ to about 8 hydroxyls per nm$^2$, about 1.9 hydroxyls per nm$^2$ to about 8 hydroxyls per nm$^2$, about 2.0 hydroxyls per nm$^2$ to about 8 hydroxyls per nm$^2$, about 2.2 hydroxyls per nm$^2$ to about 8 hydroxyls per nm$^2$, about 2.4 hydroxyls per nm$^2$ to about 8 hydroxyls per nm$^2$, about 2.6 hydroxyls per nm$^2$ to about 8 hydroxyls per nm$^2$, about 2.8 hydroxyls per nm$^2$ to about 8 hydroxyls per nm$^2$, about 3 hydroxyls per nm$^2$ to about 8 hydroxyls per nm$^2$, about 3 hydroxyls per nm$^2$ to about 7.5 hydroxyls per nm$^2$, about 3 hydroxyls per nm$^2$ to about 7 hydroxyls per nm$^2$, about 3 hydroxyls per nm$^2$ to about 6.5 hydroxyls per nm$^2$, about 3 hydroxyls per nm$^2$ to about 6 hydroxyls per nm$^2$, or about 4 hydroxyls per nm$^2$ to about 6 hydroxyls per nm$^2$.

The surface hydroxyl group density colloidal silica particles can be determined using any suitable method. In an embodiment, an aqueous dispersion of the colloidal silica particles can be adjusted to have a pH of 4.0 to prepare a titration sample. The titration sample can be titrated with an aqueous sodium hydroxide solution having a known concentration to a pH of 9.0 to determine the number of hydroxyl groups present in the titration sample. The surface area of the colloidal silica particles can be determined using any suitable method, for example, by the BET method. The number of hydroxyl groups per nm$^2$ can thus be determined.

The colloidal silica particles can be surface-modified using any suitable method. In an embodiment, the colloidal silica particles are dispersed in a carrier such as water and are then surface-treated with a suitable source of metal ions. In an embodiment, the source of metal ions is a water-soluble metallic salt. For example, an aqueous dispersion of colloidal silica particles can be treated with an aqueous solution of a metal salt such that the surface of the colloidal silica particles becomes associated with the metal ions. The association of the metal ions with the surface of the colloidal silica particles is thought to involve bonding with silanol groups found on the surface of the colloidal silica particles. The metal ions are associated with the surface of the colloidal silica particle, and are not within the interior of the particles.

The colloidal silica particles comprise about 0.1 or more, for example, about 0.11 or more, about 0.12 or more, about 0.13 or more, about 0.14 or more, or about 0.15 or more metal ions per nm$^2$ of the surface area of the particles. Alternatively, or in addition, the colloidal silica particles comprise about 0.2 or less, for example, about 0.19 or less, about 0.18 or less, about 0.17 or less, or about 0.16 or less) of metal ions per nm$^2$ of the surface area of the particles. Thus, the colloidal silica particles can comprise an amount of metal ions per nm$^2$ of the surface area of the particles bounded by any two of the aforementioned endpoints. For example, the colloidal silica particles can comprise about 0.1 to about 0.2, about 0.1 to about 0.19, about 0.1 to about 0.18, about 0.1 to about 0.17, about 0.1 to about 0.16, about 0.11 to about 0.2, about 0.12 to about 0.2, about 0.13 to about 0.2, about 0.14 to about 0.2, or about 0.15 to about 0.2 of metal ions per nm$^2$ of the surface area of the particles.

The number of metal ions per nm$^2$ of the surface area of the particles can be determined using any suitable method. In an embodiment, the surface area can be determined, for example, using a BET method. A dispersion of colloidal silica particles can be treated with an aqueous solution having a known concentration of metal ions. After a suitable treatment period, the concentration of metal ions remaining in solution can be determined. The difference in starting metal ion concentration and the concentration after treatment represents the amount of metal ions associated with the surface of the colloidal silica particles, thereby allowing calculation of the number of metal ions per nm$^2$ of the surface area of the particles.

The colloidal silica particles can have any suitable average particle size. The colloidal silica particles can have an average particle size of about 20 nm or more, about 25 nm or more, about 30 nm or more, about 35 nm or more, about 40 nm or more, about 45 nm or more, or about 50 nm or more. Alternatively, or in addition, the colloidal silica particles can have an average particle size of about 100 nm or less, for example, about 90 nm or less, about 80 nm or less, about 70 nm or less, or about 60 nm or less. Thus, the colloidal silica particles can have an average particle size bounded by any two of the aforementioned endpoints. For example, the colloidal silica particles can have an average particle size of about 20 nm to about 100 nm, about 20 nm to about 90 nm, about 20 nm to about 80 nm, about 20 nm to about 70 nm, about 20 nm to about 60 nm, about 30 nm to about 100 nm, about 30 nm to about 90 nm, about 30 nm to about 80 nm, about 30 nm to about 70 nm, or about 30 nm to about 60 nm. The colloidal silica can have any suitable morphology. The colloidal silica can have a spherical morphology, an oval morphology, or a nonspherical "cocoon" morphology. The size of the particle is the diameter of the smallest sphere that encompasses the particle. The particle size of the colloidal silica particles can be measured using any suitable technique, for example, using laser diffraction techniques. Suitable particle size measurement instruments are available from e.g., Malvern Instruments (Malvern, UK).

The colloidal silica particles preferably are colloidally stable in the inventive polishing composition. The term colloid refers to the suspension of particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of [B]−[T]/[C] is less than or equal to 0.3, and most preferably is less than or equal to 0.1.

The polishing composition can comprise any suitable amount of colloidal silica particles. The polishing composition can comprise about 5 wt. % or less, for example, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less, or about 0.5 wt. % or less of colloidal silica particles. Alternatively, or in addition, the polishing composition can comprise about 0.1 wt. % or more, for example, about 0.2 wt. % or more, about 0.3 wt. % or more, about 0.4 wt. % or more, about 0.5 wt. % or more, or about 1 wt. % or more of colloidal silica particles. Thus, the polishing composition can comprise colloidal silica particles in an amount bounded by any two of the aforementioned endpoints. For example, the polishing composition can comprise about 0.1 wt. % to about 5 wt. % of colloidal silica particles, about 0.1 wt. % to about 4 wt. %, about 0.1 wt. % to about 3 wt. %, about 0.1 wt. % to about 2 wt. %, about 0.1 wt. % to about 1 wt. %, about 0.2 wt. % to about 2 wt. %, or about 0.2 wt. % to about 1 wt. % of colloidal silica particles.

The polishing composition comprises an anionic surfactant. The anionic surfactant can be a polymer or copolymer of monomers comprising functional groups selected from carboxylic acids, sulfonic acids, phosphoric acids, and combinations thereof. In an embodiment, the anionic surfactant is a polymer or copolymer comprising acrylic acid monomers. In a preferred embodiment, the anionic surfactant is a poly(acrylic acid-co-maleic acid) copolymer.

The polishing composition comprises any suitable amount of anionic surfactant. The polishing composition can comprise about 1 ppm or more, for example, 5 ppm or more, about 10 ppm or more, about 25 ppm or more, or about 50 ppm or more of the anionic surfactant. Alternatively, or in addition, the polishing composition can comprise about 1000 ppm or less, for example, about 900 ppm or less, about 800 ppm or less, about 700 ppm or less, about 600 ppm or less, about 500 ppm or less, about 400 ppm or less, about 300 ppm or less, or about 200 ppm or less, of the anionic surfactant. Thus, the polishing composition can comprise the anionic surfactant in an amount bounded by any two of the aforementioned endpoints. For example, the polishing composition can comprise about 1 ppm to about 1000 ppm, about 5 ppm to about 500 ppm, about 5 ppm to about 400 ppm, about 5 ppm to about 300, about 5 ppm to about 200 ppm, or about 10 ppm to about 200 ppm of the anionic surfactant, and the like.

When the anionic surfactant is a polymer or copolymer, the anionic surfactant can have any suitable molecular weight. Typically, the anionic surfactant can have a molecular weight of about 100,000 Daltons or less, e.g., about 90,000 Daltons or less, about 80,000 Daltons or less, about 70,000 Daltons or less, about 60,000 Daltons or less, or about 50,000 Daltons or less.

In other embodiments, the anionic surfactant can be a polymer or copolymer comprising sulfonic acid groups. Non-limiting examples of polymers or copolymers comprising sulfonic acid groups include polystyrenesulfonic acid and WE001.

In other embodiments, the anionic surfactant can be a monomeric surfactant comprising sulfonic acid groups. The surfactant can be an alkyldiphenyloxide sulfonate surfactant having the structure:

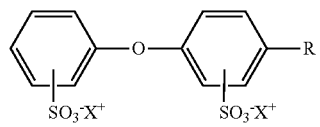

wherein R is a $C_1$-$C_{30}$, preferably $C_6$-$C_{30}$, more preferably $C_6$-$C_{22}$, linear or branched, saturated or unsaturated alkyl group, wherein the alkyl group optionally contains one or more heteroatoms selected from the group consisting of O and N, and wherein $X^+$ is H or a cation, e.g., an alkali metal cation or alkaline earth cation (e.g., sodium, potassium, lithium, calcium, magnesium, and the like). Examples of suitable alkyldiphenyloxide sulfonate surfactants include surfactants commercially available from the Dow Chemical Company (Midland, Mich.) under the trade names Dowfax™ 2A1, Dowfax™ 3B2, Dowfax™ 8390, Dowfax™ C6L, Dowfax™ C10L, and Dowfax™ 30599.

In other embodiments, the anionic surfactant can be a linear or branched alkylbenzenesulfonate, such as dodecylbenzene sulfonate.

It will be understood that the anionic surfactant can be in the form of a free acid, a salt thereof (e.g., a sodium, potassium, or ammonium salt) or, when the anionic surfactant possesses more than one acidic group, in the form of a partial salt thereof.

In certain embodiments, the polishing composition can further comprise a nonionic surfactant. The nonionic surfactant can be any suitable nonionic surfactant. Non-limiting examples of suitable nonionic surfactants include BRIJ™ and polyethylene oxide surfactants, PLURONIC™ L-64, polyvinylmethylether, polyethylene glycol, polyoxyethylene 23 lauryl ether, polypropanoic acid, polyacrylic acid, and polyether glycol bis(ether).

The chemical-mechanical polishing composition can comprise one or more buffering agents (i.e., compounds capable of adjusting the pH of the polishing composition. The pH of the polishing composition can be adjusted using any suitable buffering agent capable of adjusting the pH of the polishing composition. The buffering agent can be any suitable buffering agent and can be an organic buffering agent or an inorganic buffering agent. In an embodiment, the buffering agent can be an organic carboxylic acid, for example, acetic acid. The buffering agent desirably is water-soluble and compatible with the other components of the polishing composition. Typically, the chemical-mechanical polishing composition has a pH of about 2 to about 7 at the point-of-use. Preferably, the chemical-mechanical polishing composition has a pH of about 3 to about 4 at the point-of-use.

Typically, the buffering agent is capable of buffering an acidic pH of the polishing composition. Accordingly, it is desirable that the pH of the polishing composition is less than 7.0, e.g., 6.5+/−0.5, 6.0+/−0.5, 5.5+/−0.5, 5.0+/−0.5, 4.5+/−0.5, 4.0+/−0.5, 3.5+/−0.5, 3.0+/−0.5, 2.5+/−0.5, or 2.0+/−0.5. The buffering agent typically has at least one ionizable group having a pKa of about 3 to about 7 when measured at 25° C.

The polishing composition is free or substantially free of an oxidizing agent that oxidizes a metal. As used herein, the phrase "free of oxidizing agent" means that the polishing composition includes no more than trace contaminant amounts of oxidizing materials, which amounts are insufficient to affect any metal removal rate obtainable with the composition during CMP. In a particular embodiment, the polishing composition is free or substantially free of hydrogen peroxide, ferric nitrate, potassium iodate, peracetic acid, and potassium permanganate.

The chemical-mechanical polishing composition optionally further comprises one or more additives. Illustrative additives include conditioners, complexing agents, chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., anionic surfactant, buffering agent, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., colloidal silica particles that are surface-modified with metal ions, anionic surfactant, buffering agent, and/or any optional additive) as well as any combination of ingredients (e.g., colloidal silica particles that are surface-modified with metal ions, anionic surfactant, buffering agent, etc.).

For example, the polishing composition can be prepared by (i) providing all or a portion of the liquid carrier, (ii) dispersing the colloidal silica particles that are surface-modified with metal ions, anionic surfactant, buffering agent, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, anionic surfactant, buffering agent, and/or any optional additive) in a slurry of colloidal silica particles that are surface-modified with metal ions, (ii) providing one or more components in an additive solution (e.g., liquid carrier, anionic surfactant, buffering agent, and/or any optional additive), (iii) combining the slurry of colloidal silica particles that are surface-modified with metal ions and the additive solution to form a mixture, (iv) optionally adding suitable amounts of any other optional additives to the mixture, and (v) adjusting the pH of the mixture as appropriate.

The polishing composition can be supplied as a one-package system comprising colloidal silica particles that are surface-modified with metal ions, anionic surfactant, buffering agent, and/or any optional additive, and water. Alternatively, the polishing composition of the invention is supplied as a two-package system comprising a slurry of colloidal silica particles that are surface-modified with metal ions and an additive solution, wherein the slurry of colloidal silica particles that are surface-modified with metal ions consists essentially of, or consists of, colloidal silica particles that are surface-modified with metal ion and water, and wherein the additive solution consists essentially of, or consists of, anionic surfactant, buffering agent, and/or any optional additive.

Various methods can be employed to utilize such a two-package polishing system. For example, the slurry of colloidal silica particles that are surface-modified with metal ions and additive solution can be delivered to the polishing table by different pipes that are joined and connected at the outlet of supply piping. The slurry of colloidal silica particles that are surface-modified with metal ions and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the colloidal silica particles that are surface-modified with metal ions, anionic surfactant, buffering agent, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the colloidal silica particles that are surface-modified with metal ions, anionic surfactant, buffering agent, and/or any optional additive are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of silicon nitride. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon nitride, silicon oxide, and/or polysilicon, e.g., any one, two, or especially all three of the aforementioned materials.

In certain embodiments, the substrate comprises polysilicon in combination with silicon nitride and/or silicon oxide. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), PETEOS, thermal oxide, undoped silicate glass, and HDP oxide. Other suitable metal oxides include partially-stabilized zirconia (PSZ).

The chemical-mechanical polishing composition of the invention desirably exhibits a high removal rate when polishing a substrate comprising silicon nitride according to a method of the invention. For example, when polishing silicon wafers comprising silicon nitride in accordance with an embodiment of the invention, the polishing composition desirably exhibits a silicon nitride removal rate of about 100 Å/min or higher, 150 Å/min or higher, about 200 Å/min or higher, about 250 Å/min or higher, about 300 Å/min or higher, about 350 Å/min or higher, about 400 Å/min or higher, about 450 Å/min or higher, or about 500 Å/min or higher.

The chemical-mechanical polishing composition of the invention desirably exhibits a low removal rate when polishing a substrate comprising silicon oxide according to a method of the invention. For example, when polishing silicon wafers comprising silicon oxide in accordance with an embodiment of the invention, the polishing composition desirably exhibits a removal rate of the silicon oxide of about 50 Å/min or lower, about 45 Å/min or lower, about 40 Å/min or lower, about 35 Å/min or lower, about 30 Å/min or lower, about 25 Å/min or lower, about 20 Å/min or lower, about 15 Å/min or lower, about 10 Å/min or lower, or even about 5 Å/min or lower.

The chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 50 Å/min or lower, about 45 Å/min or lower, about 40 Å/min or lower, about 35 Å/min or lower, about 30 Å/min or lower, about 25 Å/min or lower, about 20 Å/min or lower, about 15 Å/min or lower, about 10 Å/min or lower, or even about 5 Å/min or lower.

The chemical-mechanical polishing composition of the invention can be tailored to provide effective polishing at the desired polishing ranges selective to specific thin layer materials, while at the same time minimizing surface imperfections, defects, corrosion, erosion, and the removal of stop layers. The selectivity can be controlled, to some extent, by altering the relative concentrations of the components of the polishing composition. When desirable, the chemical-mechanical polishing composition of the invention can be used to polish a substrate with a silicon nitride to silicon oxide polishing selectivity of about 5:1 or higher (e.g., about 10:1 or higher, about 15:1 or higher, about 20:1 or higher, or about 25:1 or even higher). Also, the chemical-mechanical polishing composition of the invention can be used to polish a substrate with a silicon nitride to polysilicon polishing selectivity of about 2:1 or higher (e.g., about 4:1 or higher, about 6:1 or higher, or about 8:1 or higher).

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 Eminess Technologies), POLITEX™ (Dow Chemical Company), and POLYPAS™ 27 (Fujibo). A particularly preferred polishing pad is the EPIC™ D100 pad commercially available from Cabot Microelectronics.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a substrate being polished enables the determination of the polishing end-point, i.e., the determination of when to terminate the polishing process with respect to a particular substrate.

The following examples further illustrate the invention but, of course, should not be construed as in any way limiting its scope.

Example 1

This example demonstrates the effect of surface modification of colloidal silica particles with aluminum on silicon nitride and silicon oxide removal rate.

Separate substrates comprising blanket layers of silicon nitride and silicon oxide were polished with three different polishing compositions, Polishing Compositions 1A-1C. All of the polishing compositions comprised 1 wt. % of colloidal silica particles having an average particle size of about 80 nm in water at a pH of 3.5. Polishing Composition 1A (control) comprised untreated colloidal silica particles. Polishing Compositions 1B and 1C (invention) comprised colloidal silica particles particles having an average particle size of about 80 nm that were surface-treated with a solution of aluminum nitrate in water at a concentration of 400 ppm and 800 ppm of aluminum, respectively. Following polishing, the removal rates for silicon nitride and silicon oxide were determined. The results, and the silicon nitride/silicon oxide selectivities, are set forth in Table 1.

TABLE 1

| Polishing Composition | Treatment Level (ppm as Al) | SiN Removal Rate (Å/min) | SiO Removal Rate (Å/min) | SiN/SiO Selectivity |
|---|---|---|---|---|
| 1A (control) | None | 252 | 1058 | 0.24 |
| 1B (invention) | 400 | 445 | 111 | 4 |
| 1C (invention) | 800 | 451 | 29 | 15 |

As is apparent from the results set forth in Table 1, Polishing Compositions 1B and 1C, which contained colloidal silica particles that were surface-treated with aluminum ions, exhibited silicon nitride removal rates that were approximately 1.76 and 1.79 times, respectively, greater than the silicon nitride removal rate exhibited by the control polishing composition. Polishing Compositions 1B and 1C, which contained colloidal silica particles treated with aluminum ions, exhibited silicon oxide removal rates that were approximately 0.10 and 0.03 times, respectively, the silicon oxide removal rate exhibited by control Polishing Composition 1A.

Example 2

This example compares silicon nitride removal rates and silicon oxide removal rates observed with a polishing composition comprising colloidal silica particles that were surface-treated with aluminum ions with silicon nitride removal rates and silicon oxide removal rates observed with a polishing composition comprising colloidal silica particles having a uniform distribution of aluminum ions throughout the particles.

Separate substrates comprising blanket layers of silicon nitride and silicon oxide were polished with two different polishing compositions, Polishing Compositions 2A and 2B. Polishing Composition 2A (comparative) comprised 1 wt. % of colloidal silica particles having an average particle size of about 45 nm and having a uniform distribution of aluminum ions throughout the particles. Polishing Composition 2B (invention) comprised 1 wt. % of colloidal silica particles that were surface-treated with aluminum ions and having an average particle size of about 50 nm. Following polishing, the removal rates for silicon nitride and silicon oxide were determined. The results, and the silicon nitride/silicon oxide selectivities, are set forth in Table 2.

TABLE 2

| Polishing Composition | SiN Removal Rate (Å/min) | SiO Removal Rate (Å/min) | SiN/SiO Selectivity |
|---|---|---|---|
| 2A (comparative) | 390 | 21 | 18 |
| 2B (invention) | 512 | 23 | 22 |

As is apparent from the results set forth in Table 2, Polishing Composition 2B, which contained colloidal silica particles that were surface-treated with aluminum ions, exhibited a silicon nitride removal rate that was approximately 1.3 times the silicon nitride removal rate exhibited by Polishing Composition 2A, which contained colloidal silica particles having a uniform distribution of aluminum ions throughout the particles. In addition, Polishing Composition 2B exhibited a SiN/SiO selectivity that was approximately 1.22 times greater than the SiN/SiO selectivity exhibited by Polishing Composition 2A.

Example 3

This example demonstrates the effect on active oxide loss in the polishing of patterned substrates comprising a layer of silicon nitride over a patterned silicon oxide substrate observed with a polishing composition comprising colloidal silica particles that were surface-treated with aluminum ions.

Patterned substrates comprising a layer of silicon nitride over a patterned silicon oxide substrate were polished with two different polishing compositions, Polishing Compositions 3A and 3B. Polishing Composition 3A (comparative) comprised 1 wt. % of colloidal silica particles having an average particle size of about 45 nm and having a uniform distribution of aluminum ions throughout the particles. Polishing Composition 3B (invention) comprised 1 wt. % of colloidal silica particles that were surface-treated with aluminum ions and have an average particle size of about 50 nm. The substrates comprised the following patterns: (a) 100 µm feature width and 50% pattern density, (b) 200 µm feature width and 50% pattern density, (c) 400 µm feature width and 50% pattern density, (d) 900 µm feature width and 50% pattern density, (e) 1800 µm feature width and 50% pattern density, (f) 2 µm feature width and 50% pattern density, (g) 20 µm feature width and 50% pattern density, (h) 50 µm feature width and 50% pattern density, (i) 50 µm feature width and 90% pattern density, (j) 50 µm feature width and 10% pattern density, and (k) 0.36 µm feature width and 38% pattern density. All of the substrates were polished to endpoint and then 10 s of overpolishing.

Following polishing, the thickness of the remaining active oxide (the oxide outside of the trenches) was measured, and the results are set forth in Table 3.

TABLE 3

| Feature Width and Density | Remaining Active Oxide | | |
|---|---|---|---|
| | Polishing Composition 3A (comparative) | Polishing Composition 3B (invention) | Starting oxide thickness |
| 100 µm and 50% | 700 | 1070 | 1160 |
| 200 µm and 50% | 650 | 1080 | 1160 |
| 400 µm and 50% | 960 | 1100 | 1160 |
| 900 µm and 50% | 1050 | 1120 | 1160 |
| 1800 µm and 50% | 1080 | 1120 | 1160 |
| 2 µm and 50% | 1110 | 1160 | 1160 |
| 20 µm and 50% | 880 | 1140 | 1160 |
| 50 µm and 50% | 600 | 1080 | 1150 |
| 50 µm and 90% | 1060 | 1150 | 1160 |
| 50 µm and 10% | 100 | 1040 | 1150 |
| 0.36 µm and 38% | 1130 | 1130 | 1160 |

As is apparent from the results set forth in Table 3, Polishing Composition 3B exhibited no greater than an approximately 2.6% reduction in remaining active oxide. Polishing Composition 3A exhibited significantly greater reduction in remaining active oxide except at 2 µm feature width at 50% pattern density and at 0.36 µm feature width at 38% pattern density.

Example 4

This example demonstrates the effect on silicon nitride and silicon oxide removal rates observed with a polishing composition comprising an anionic surfactant and colloidal silica particles that were surface-treated with aluminum ions.

Separate substrates comprising blanket layers of silicon nitride and silicon oxide were polished with 28 different polishing compositions, Polishing Compositions 4AA-4BB. Each of the Polishing Compositions contained colloidal silica particles that were surface-treated with aluminum ions in amounts and that have particle sizes as set forth in Table 4. Polishing Compositions 4AB-4AD, 4AF-4AJ, 4AL-4AP, 4AQ-4AV, and 4AX-4BB further contained a poly(acrylic acid-co-maleic acid) copolymer in amounts as set forth in Table 4. Following polishing, the removal rates for silicon nitride and silicon oxide were determined. The results, and the silicon nitride/silicon oxide selectivities, are set forth in Table 4.

TABLE 4

| Polishing Composition | Abrasive Particle Size (nm) | Abrasive Amount (wt. %) | Anionic Surfactant Amount (ppm) | SiN Removal Rate (Å/min) | SiO Removal Rate (Å/min) | SiN/SiO Selectivity |
|---|---|---|---|---|---|---|
| 4AA | 50 | 1 | 0 | 366 | 20 | 18 |
| 4AB | 50 | 1 | 10 | 363 | 20 | 18 |
| 4AC | 50 | 1 | 25 | 341 | 20 | 17 |
| 4AD | 50 | 1 | 50 | 297 | 20 | 15 |
| 4AE | 25 | 0.50 | 0 | 242 | 5 | 48 |
| 4AF | 25 | 0.50 | 10 | 181 | 6 | 30 |
| 4AG | 25 | 0.50 | 25 | 127 | 6 | 21 |
| 4AH | 25 | 0.50 | 50 | 91 | 9 | 10 |
| 4AI | 25 | 0.50 | 90 | 74 | 9 | 8 |
| 4AJ | 25 | 0.50 | 200 | 36 | 10 | 4 |
| 4AK | 25 | 1 | 0 | 293 | 22 | 13 |
| 4AL | 25 | 1 | 10 | 251 | 20 | 13 |
| 4AM | 25 | 1 | 25 | 183 | 21 | 9 |
| 4AN | 25 | 1 | 50 | 117 | 20 | 6 |
| 4AO | 25 | 1 | 90 | 87 | 23 | 4 |
| 4AP | 25 | 1 | 200 | 43 | 19 | 2 |
| 4AQ | 25 | 1.5 | 0 | 327 | 48 | 7 |
| 4AR | 25 | 1.5 | 10 | 238 | 43 | 6 |
| 4AS | 25 | 1.5 | 25 | 200 | 46 | 4 |
| 4AT | 25 | 1.5 | 50 | 130 | 39 | 3 |
| 4AU | 25 | 1.5 | 90 | 99 | 39 | 3 |
| 4AV | 25 | 1.5 | 200 | 41 | 38 | 1 |
| 4AW | 25 | 2 | 0 | 344 | 74 | 5 |
| 4AX | 25 | 2 | 10 | 317 | 70 | 5 |
| 4AY | 25 | 2 | 25 | 225 | 62 | 4 |
| 4AZ | 25 | 2 | 50 | 157 | 76 | 2 |
| 4BA | 25 | 2 | 90 | 69 | 78 | 1 |
| 4BB | 25 | 2 | 200 | 89 | 75 | 1 |

As is apparent from the results set forth in Table 4, at both 25 nm and 50 nm particle sizes and at all levels of surface-treated colloidal silica particles, the silicon nitride removal rate decreased with increased concentrations of the poly (acrylic acid-co-maleic acid) copolymer. The silicon oxide removal rate was not particularly affected by increased concentrations of the poly(acrylic acid-co-maleic acid) copolymer.

Example 5

This example demonstrates the effect on silicon nitride and silicon oxide removal rates observed with a polishing composition comprising an anionic surfactant and colloidal silica particles that were surface-treated with aluminum ions.

Separate substrates comprising blanket layers of silicon nitride and silicon oxide were polished with 9 different polishing compositions, Polishing Compositions 5A-5I. Each of the polishing compositions contained 1 wt. % of colloidal silica particles having an average particle size of about 25 nm that were surface-treated with aluminum ions. Polishing Composition 5A (control) did not contain an anionic surfactant. Polishing Composition 5B further contained 10 ppm of a poly(acrylic acid-co-maleic acid) copolymer. Polishing Composition 5C further contained 25 ppm of the DOWFAX™ C10L alkyldiphenyloxide sulfonate surfactant. Polishing Composition SD further contained 25 ppm of the DOWFAX™ C6L alkyldiphenyloxide sulfonate surfactant. Polishing Composition 5E further contained 25 ppm of a polystyrenesulfonate surfactant. Polishing Composition 5F further contained 25 ppm of dodecylbenzenesulfonate. Polishing Compositions 5G-5I further contained 100 ppm, 150 ppm, and 200 ppm, respectively, of WE001, which is an anionic surfactant containing both carboxylic and sulfonic acid groups. Following polishing, the removal rates for silicon nitride and silicon oxide were determined. The results, and the silicon nitride/silicon oxide selectivities, are set forth in Table 5.

Polishing Composition 5B, which contained a poly(acrylic acid-co-maleic acid), exhibited the same SiN/SiO selectivity but an approximately 14% reduction in the SiN removal rate as compared with control Polishing Composition 5A. Polishing Composition 5D, which contained DOWFAX™ C6L alkyldiphenyloxide sulfonate surfactant, exhibited a slight increase in SiN/SiO selectivity but an approximately 29% reduction in the SiN removal rate as compared with control Polishing Composition 5A. Polishing Composition 5C, which contained DOWFAX™ C10L alkyldiphenyloxide sulfonate surfactant, exhibited a lower SiN/SiO selectivity and an approximately 40% reduction in the SiN removal rate as compared with control Polishing Composition 5A. Polishing Compositions 5F-5H, which contained dodecylbenzenesulfonate, 100 ppm of WE001, and 150 ppm of WE001, respectively, exhibited improved SiN/SiO selectivities as compared with control Polishing Composition 5A. Polishing Composition 5I, which contained 200 ppm of WE001, exhibited an approximately 38% increased SiN/SiO selectivity but an approximately 19% reduction in the SiN removal rate as compared with control Polishing Composition 5A.

Example 6

This example demonstrates the effect on silicon nitride, silicon oxide, and polysilicon removal rates observed with a polishing composition comprising an anionic surfactant and colloidal silica particles that were surface-treated with aluminum ions.

Separate substrates comprising blanket layers of silicon nitride, silicon oxide, and polysilicon were polished with 4 different polishing compositions, Polishing Compositions 6A-6D. Each of the polishing compositions contained 1 wt. % of colloidal silica particles having an average particle size of about 25 nm that were surface-treated with aluminum ions. Polishing Composition 5A (control) did not an anionic surfactant. Polishing Composition 5B (invention) further contained 10 ppm of a poly(acrylic acid-co-maleic acid) copolymer. Polishing Composition 5C (comparative) further contained 100 ppm of propyl gallate Polishing Composition 5D (invention) further contained 100 ppm of WE001. Following polishing, the removal rates for silicon nitride, silicon oxide, and polysilicon were determined. The results, and the silicon nitride/polysilicon selectivities, are set forth in Table 6.

TABLE 5

| Polishing Composition | Anionic surfactant | SiN Removal Rate (Å/min) | SiO Removal Rate (Å/min) | SiN/SiO Selectivity |
|---|---|---|---|---|
| 5A (control) | None | 293 | 22 | 13 |
| 5B (invention) | poly(acrylic acid-co-maleic acid) | 251 | 20 | 13 |
| 5C (invention) | DOWFAX ™ C10L | 175 | 24 | 7 |
| 5D (invention) | DOWFAX ™ C6L | 207 | 14 | 15 |
| 5E (invention) | polystyrenesulfonate | 12 | 17 | 1 |
| 5F (invention) | dodecylbenzenesulfonate | 291 | 18 | 16 |
| 5G (invention) | WE001 | 285 | 15 | 19 |
| 5H (invention) | WE001 | 291 | 12 | 24 |
| 5I (invention) | WE001 | 237 | 13 | 18 |

As is apparent from the results set forth in Table 5, the presence of an anionic surfactant in the inventive polishing composition allows for tunable silicon nitride/silicon oxide selectivity and for tunable silicon nitride removal rate.

TABLE 6

| Polishing Composition | SiN Removal Rate (Å/min) | SiO Removal Rate (Å/min) | Polysilicon Removal Rate (Å/min) | SiN/ Polysilicon Selectivity |
|---|---|---|---|---|
| 5A (control) | 293 | 15 | 291 | 1 |
| 5B (invention) | 251 | 20 | 91 | 3 |
| 5C (comparative) | 307 | 19 | 110 | 3 |
| 5D (invention) | 279 | 11 | 33 | 8 |

As is apparent from the results set forth in Table 6, Polishing Compositions 5B and 5D, which contained anionic surfactants, exhibited silicon nitride to polysilicon selectivities of 3 and 8, respectively, while control Polishing Composition 5A exhibited a silicon nitride to polysilicon selectivity of 1. Polishing Compositions 5B and 5D exhibited silicon nitride removal rates that were approximately 86% and 95% of the silicon nitride removal rate exhibited by the control polishing composition, and exhibited polysilicon removal rates that were approximately 31% and 11% of the polysilicon removal rate exhibited by the control polishing composition, respectively.

Example 7

This example shows the reduction of silicon nitride thickness as a function of time achievable with the inventive polishing composition when used to polish patterned substrates as compared with an industry standard polishing composition.

Patterned substrates comprising a layer of silicon nitride over a patterned silicon oxide substrate were polished with two different polishing compositions, Polishing Compositions 7A and 7B. Polishing Composition 7A (comparative) comprised about 22 wt. % of fumed silica in water at a pH of about 10. Polishing Composition 7B (invention) comprised 1.% colloidal silica particles that were surface-treated with aluminum ions and 50 ppm of a poly(acrylic acid-co-maleic acid) copolymer at a pH of 3.5. The substrates comprised the following patterns: (a) 50% pattern density and 20 μm feature width, (b) 50% pattern density and 2 μm feature width, (c) 90% pattern density and 50 μm feature width, and (d) 10% pattern density and 50 μm feature width. The silicon nitride thickness was measured after 30, 60, and 90 s of polishing, and the results are set forth in Tables 7-10.

TABLE 7

50% pattern density and 20 μm feature width

| | Remaining Thickness | |
|---|---|---|
| Time (s) | Polishing Composition 7A (comparative) | Polishing Composition 7B (invention) |
| 0 | 900 | 900 |
| 30 | 690 | 490 |
| 60 | 380 | ~0 |
| 90 | 80 | ~0 |

TABLE 8

50% pattern density and 2 μm feature width

| | Remaining Thickness | |
|---|---|---|
| Time (s) | Polishing Composition 7A (comparative) | Polishing Composition 7B (invention) |
| 0 | 870 | 870 |
| 30 | 720 | 450 |
| 60 | 330 | 20 |
| 90 | 120 | ~0 |

TABLE 9

90% pattern density and 50 μm feature width

| | Remaining Thickness | |
|---|---|---|
| Time (s) | Polishing Composition 7A (comparative) | Polishing Composition 7B (invention) |
| 0 | 1150 | 1150 |
| 30 | 1000 | 900 |
| 60 | 750 | 350 |
| 90 | 450 | 20 |

TABLE 10

10% pattern density and 50 μm feature width

| | Remaining Thickness | |
|---|---|---|
| Time (s) | Polishing Composition 7A (comparative) | Polishing Composition 7B (invention) |
| 0 | 740 | 740 |
| 30 | 500 | 400 |
| 60 | 340 | 70 |
| 90 | 30 | 10 |

As is apparent from the results set forth in Tables 7-10, inventive Polishing Composition 7B exhibited a significantly faster time for removal rate of the silicon nitride layer than did the comparative Polishing Composition 7A.

Example 8

This example provides a method for determining the surface hydroxyl group (silanol group) density for colloidal silica particles.

[1] 15 g of silica particles is weighed and placed in a container (X [g]) of which a mass has been measured and then dispersed into an appropriate amount (100 ml or less) of water. In the case where the silica particles are in the form of a dispersion liquid in which the silica particles are dispersed into a medium such as water, the dispersion liquid is weighed and poured into the container so that an amount of the silica particles is 15 g.

[2] Next, a pH is adjusted to 3.0 to 3.5 by adding 0.1 mol/L hydrochloric acid, and a mass (Y [g]) at this stage is measured to detect a total mass of the liquid (Y−X [g]).

[3] The liquid in an amount (Y−X)/10 [g]) of ¹⁄₁₀ of the mass detected in [2] is weighed and poured into another container. An amount of the silica particles (A [g]) contained in the liquid at this stage is 1.5 g.

[4] 30 g of sodium chloride is added to the liquid, and ultrapure water is added until a total amount reaches to 150 g. A 0.1 mol/L sodium hydroxide solution is added to adjust a pH to 4.0 to prepare a titration sample.

[5] 0.1 mol/L sodium hydroxide was added dropwise to the titration sample until a pH reaches to 9.0, and an amount of sodium hydroxide (B [mol]) required for changing the pH from 4.0 to 9.0 is detected.

[6] A silanol group density of the silica particles is calculated by the following expression (1):

$$\rho = B \cdot N_A / A \cdot S_{BET} \quad (1)$$

(in the expression (1), NA [number/mol] represents an Avogadro number, and $S_{BET}$ [m²/g] represents a BET specific surface area of silica particles).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
  (a) colloidal silica particles that are surface modified with metal ions selected from aluminum ions, and wherein the colloidal silica particles have a surface hydroxyl group density of from about 1.5 hydroxyls per nm² to about 8 hydroxyls per nm² of a surface area of the particles, and wherein the colloidal silica particles comprise about 0.1 to about 0.2 metal ions per nm² of the surface area of the particles,
  (b) an anionic surfactant,
  (c) a buffering agent, and
  (d) water,
  wherein the polishing composition has a pH of about 2 to about 7, and
  wherein the polishing composition is substantially free of an oxidizing agent that oxidizes a metal.

2. The polishing composition of claim 1, wherein the colloidal silica particles are present in an amount of from about 0.1 wt. % to about 5 wt. %.

3. The polishing composition of claim 1, wherein the colloidal silica particles have an average particle diameter of from about 20 nm to about 100 nm.

4. The polishing composition of claim 1, wherein the anionic surfactant is a polymer or copolymer of monomers comprising functional groups selected from carboxylic acids, sulfonic acids, phosphoric acids, and combinations thereof, wherein the anionic surfactant has an average molecular weight of about 100,000 Daltons or less, and wherein the anionic surfactant is present in an amount of about 5 ppm to about 200 ppm.

5. The polishing composition of claim 4, wherein the anionic surfactant is a poly(acrylic acid co maleic acid) copolymer.

6. The polishing composition of claim 1, wherein the anionic surfactant is a monomeric surfactant comprising at least one sulfonic acid group.

7. The polishing composition of claim 1, wherein the polishing composition further comprises a nonionic surfactant.

8. The polishing composition of claim 1, wherein the buffering agent comprises an organic carboxylic acid.

9. The polishing composition of claim 1, wherein the polishing composition is substantially free of hydrogen peroxide, ferric nitrate, potassium iodate, peracetic acid, and potassium permanganate.

10. A method of chemically mechanically polishing a substrate comprising:
  (i) contacting a substrate with a polishing pad and a chemical-mechanical polishing composition comprising:
  (a) colloidal silica particles that are surface modified with metal ions selected from aluminum ions, and wherein the colloidal silica particles have a surface hydroxyl group density of from about 1.5 hydroxyls per nm² to about 8 hydroxyls per nm² of a surface area of the particles, and wherein the colloidal silica particles comprise about 0.1 to about 0.2 metal ions per nm² of the surface area of the particles,
  (b) an anionic surfactant,
  (c) a buffering agent, and
  (d) water, wherein the polishing composition has a pH of about 2 to about 7, and wherein the polishing composition is substantially free of an oxidizing agent that oxidizes a metal,
(ii) moving the polishing pad and the chemical mechanical polishing composition relative to the substrate, and
(iii) abrading at least a portion of the substrate to polish the substrate.

11. The method of claim 10, wherein the colloidal silica particles are present in an amount of from about 0.1 wt. % to about 5 wt. %.

12. The method of claim 10, wherein the colloidal silica particles have an average particle diameter of from about 20 nm to about 100 nm.

13. The method of claim 10, wherein the anionic surfactant is a polymer or copolymer of monomers comprising functional groups selected from carboxylic acids, sulfonic acids, phosphoric acids, and combinations thereof, wherein the anionic surfactant has an average molecular weight of about 100,000 Daltons or less, and wherein the anionic surfactant is present in an amount of about 5 ppm to about 200 ppm.

14. The method of claim 13, wherein the anionic surfactant is a poly(acrylic acid co maleic acid) copolymer.

15. The method of claim 13, wherein the anionic surfactant is a monomeric surfactant comprising at least one sulfonic acid group.

16. The method of claim 10, wherein the polishing composition further comprises a nonionic surfactant.

17. The method of claim 10, wherein the buffering agent comprises an organic carboxylic acid.

18. The method of claim 10, wherein the polishing composition is substantially free of hydrogen peroxide, ferric nitrate, potassium iodate, peracetic acid, and potassium permanganate.

19. The method of claim 10, wherein the substrate comprises silicon nitride, and wherein at least a portion of the silicon nitride is abraded to polish the substrate.

20. The method of claim 19, wherein the substrate further comprises silicon oxide, and wherein at least a portion of the silicon oxide is abraded to polish the substrate.

21. The method of claim 19, wherein the substrate further comprises polysilicon, and wherein at least a portion of the polysilicon is abraded to polish the substrate.

* * * * *